(12) United States Patent
Lin et al.

(10) Patent No.: US 10,157,888 B1
(45) Date of Patent: Dec. 18, 2018

(54) INTEGRATED FAN-OUT PACKAGES AND METHODS OF FORMING THE SAME

(71) Applicant: Taiwan Semiconductor Manufacturing Co., Ltd., Hsinchu (TW)

(72) Inventors: Jing-Cheng Lin, Hsinchu (TW); Tsung-Fu Tsai, Changhua County (TW); Chen-Hua Yu, Hsinchu (TW); Po-Hao Tsai, Taoyuan (TW); Shih-Ting Lin, Taipei (TW); Szu-Wei Lu, Hsinchu (TW); Hung-Wei Tsai, Changhua County (TW); Chen-Hsuan Tsai, Taitung Cityan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 18 days.

(21) Appl. No.: 15/627,458

(22) Filed: Jun. 20, 2017

(51) Int. Cl.
*H01L 21/68* (2006.01)
*H01L 23/31* (2006.01)
(Continued)

(52) U.S. Cl.
CPC ........ *H01L 25/0657* (2013.01); *H01L 21/563* (2013.01); *H01L 23/3142* (2013.01); *H01L 23/5386* (2013.01); *H01L 24/03* (2013.01); *H01L 24/06* (2013.01); *H01L 24/17* (2013.01); *H01L 24/19* (2013.01); *H01L 24/24* (2013.01); *H01L 24/81* (2013.01); *H01L 25/50* (2013.01); *H01L 21/568* (2013.01); *H01L 21/6835* (2013.01); *H01L 22/32* (2013.01); *H01L 25/105* (2013.01); *H01L 2221/68359* (2013.01); *H01L 2224/024* (2013.01); *H01L 2224/0239* (2013.01); *H01L 2224/02379* (2013.01);
(Continued)

(58) Field of Classification Search
CPC ... H01L 25/06; H01L 25/065; H01L 25/0657; H01L 25/50; H01L 25/10; H01L 25/105; H01L 24/03; H01L 24/06; H01L 24/17; H01L 24/19; H01L 24/24; H01L 24/81; H01L 23/31; H01L 23/314; H01L 23/3142; H01L 23/53; H01L 23/538; H01L 23/5386; H01L 22/32; H01L 21/56; H01L 21/563; H01L 21/568; H01L 21/68; H01L 21/683; H01L 21/6835
USPC ......................................................... 257/737
See application file for complete search history.

(56) References Cited

U.S. PATENT DOCUMENTS 9,000,584 B2   4/2015   Lin et al.
9,048,222 B2   6/2015   Hung et al.
(Continued)

*Primary Examiner* — Monica D Harrison
(74) *Attorney, Agent, or Firm* — JCIPRNET

(57) ABSTRACT

Integrated fan-out packages and methods of forming the same are disclosed. An integrated fan-out package includes a first chip, a redistribution layer structure, a plurality of connection pads, a plurality of dummy patterns, a plurality of micro-bumps, a second chip and an underfill layer. The redistribution layer structure is electrically connected to the first chip. The connection pads are electrically connected to the redistribution layer structure. The dummy patterns are at one side of the connection pads. The micro-bumps are electrically connected to the connection pads. The second chip is electrically connected to the micro-bumps. The underfill layer covers the plurality of dummy patterns and surrounds the micro-bumps.

20 Claims, 24 Drawing Sheets

(51) Int. Cl.
  H01L 25/065 (2006.01)
  H01L 23/538 (2006.01)
  H01L 23/00 (2006.01)
  H01L 21/56 (2006.01)
  H01L 25/00 (2006.01)
  H01L 21/66 (2006.01)
  H01L 25/10 (2006.01)
  H01L 21/683 (2006.01)

(52) U.S. Cl.
  CPC ........... *H01L 2224/0362* (2013.01); *H01L 2224/03462* (2013.01); *H01L 2224/03622* (2013.01); *H01L 2224/0401* (2013.01); *H01L 2224/05005* (2013.01); *H01L 2224/05147* (2013.01); *H01L 2224/05155* (2013.01); *H01L 2224/05166* (2013.01); *H01L 2224/06515* (2013.01); *H01L 2224/11002* (2013.01); *H01L 2224/11462* (2013.01); *H01L 2224/13144* (2013.01); *H01L 2224/13147* (2013.01); *H01L 2224/16145* (2013.01); *H01L 2224/215* (2013.01); *H01L 2224/24147* (2013.01); *H01L 2224/81005* (2013.01); *H01L 2224/81191* (2013.01); *H01L 2225/06513* (2013.01); *H01L 2225/06548* (2013.01); *H01L 2225/06555* (2013.01); *H01L 2225/06586* (2013.01); *H01L 2225/06596* (2013.01); *H01L 2225/1058* (2013.01); *H01L 2924/014* (2013.01); *H01L 2924/0105* (2013.01); *H01L 2924/01022* (2013.01); *H01L 2924/01028* (2013.01); *H01L 2924/01029* (2013.01); *H01L 2924/01047* (2013.01); *H01L 2924/06* (2013.01); *H01L 2924/07025* (2013.01); *H01L 2924/19011* (2013.01); *H01L 2924/19102* (2013.01)

(56) References Cited

U.S. PATENT DOCUMENTS

| | | |
|---|---|---|
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,607,967 B1 * | 3/2017 | Shih .................... H01L 25/0657 |

* cited by examiner

US 10,157,888 B1

INTEGRATED FAN-OUT PACKAGES AND METHODS OF FORMING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of types of packages for semiconductors include quad flat packages (QFP), pin grid array (PGA) packages, ball grid array (BGA) packages, flip chips (FC), three-dimensional integrated circuits (3DICs), wafer level packages (WLPs), and package on package (PoP) devices, etc. Currently, integrated fan-out packages are becoming increasingly popular for their compactness. However, there are many challenges related to integrated fan-out packages.

DETAILED DESCRIPTION

Figure 1A:
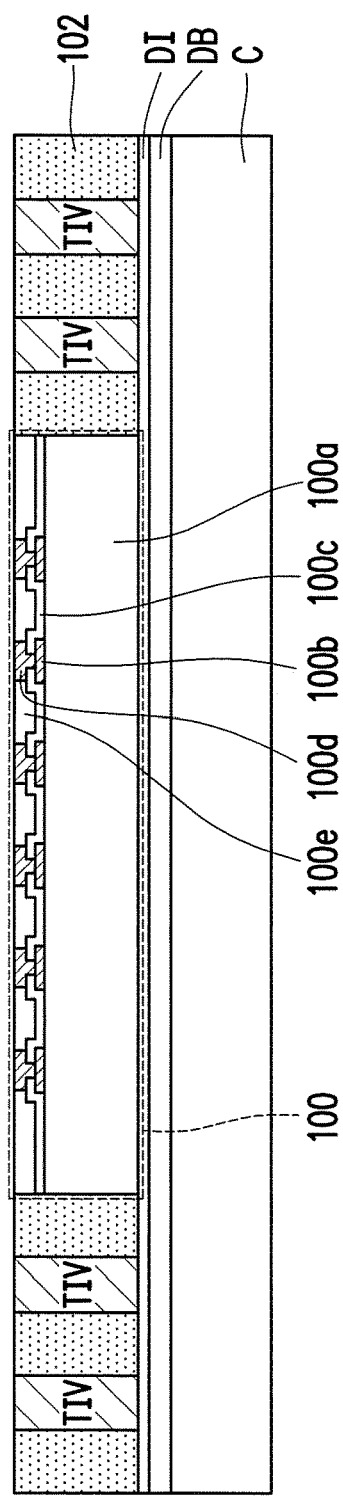
FIG. 1A to FIG. 1F are cross-sectional views of a method of forming an integrated fan-out package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1F are cross-sectional views of a method of forming an integrated fan-out package in accordance with some embodiments. FIG. 2 to FIG. 8 are simplified top views of integrated fan-out packages in accordance with some embodiments, in which few elements such as micro-bumps, bumps and dummy patterns are shown for simplicity and clarity of illustration.

Referring to FIG. 1A, a carrier C is provided with a first chip 100 and a plurality of through integrated fan-out vias TIV aside the first chip 100. In some embodiments, the carrier C has a de-bonding layer DB and a dielectric layer DI formed thereon, and the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polymer layer formed on the de-bonding layer. For example, the dielectric layer DI includes polybenzoxazole (PBO), polyimide (PI), a suitable organic or inorganic material or the like. In some embodiments, the first chip 100 has a substrate 100a, pads 100b over the substrate 100a, a passivation layer 100c over the substrate 100a and exposing portions of the pads 100b, connectors 100d over the passivation layer 100c and electrically connected to the pads 100b, and a protection layer 100e over the passivation layer 100c and aside the connectors 100d. In some embodiments, the connectors 100d include solder bumps, gold bumps, copper pillars or the like, and are formed by an electroplating process. In some embodiments, the protection layer 100e includes polybenzoxazole (PBO), polyimide (PI), a suitable organic or inorganic material or the like. In some embodiments, the through integrated fan-out vias TIV include copper and are formed by photolithography, plating, and photoresist stripping processes. In some embodiments, the first chip 100 is picked and placed on the carrier C with the backside thereof facing the dielectric layer DI, and the through integrated fan-out vias TIV are then formed on the carrier C.

Continue referring to FIG. 1A, an encapsulant 102 is formed over the carrier C to encapsulate the first chip 100 and the through integrated fan-out vias TIV. In some embodiments, the encapsulant 102 surrounds the first chip 100 and the through integrated fan-out vias TIV, and exposes the surfaces of the through integrated fan-out vias TIV and the connectors 100d. The encapsulant 102 includes a molding compound such as epoxy, a photo-sensitive material such as polybenzoxazole (PB 0), polyimide (PI) or benzocyclobutene (BCB), a combination thereof or the like. The method of forming the encapsulant 102 includes forming an encapsulant material layer on the carrier C covering the first chip 100 and the through integrated fan-out vias TIV, and performing a grinding process to partially remove the encapsulant material layer until the surfaces of the through integrated fan-out vias TIV and the connectors 100d are exposed.

Figure 1B:
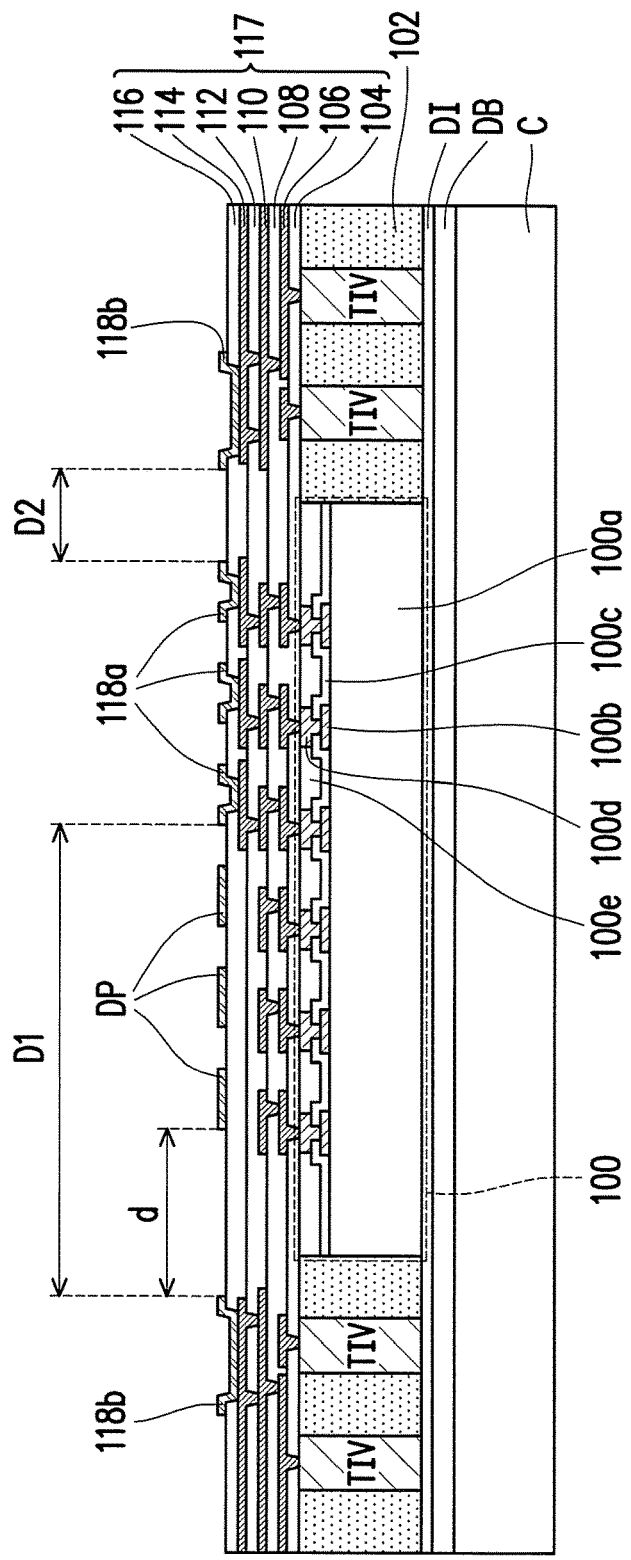

Referring to FIG. 1B, a front-side redistribution layer structure 117 is formed over and electrically connected to the first chip 100. In some embodiments, the redistribution layer structure 117 includes a plurality of polymer layers 104, 108, 112 and 116 and a plurality of redistribution layers 106, 110 and 114 stacked alternately. Specifically, the redistribution layer 106 is electrically connected to the connectors 100d and the through integrated fan-out vias TIV and penetrates through the polymer layer 104, the redistribution layer 110 is electrically connected to the redistribution layer 106 and penetrates through the polymer layer 108, the redistribution layer 114 is electrically connected to the redistribution layer 110 and penetrates through the polymer layer 112, and the polymer layer 116 covers the redistribution layer 114. In some embodiments, each of the polymer layers 104, 108, 112 and 116 includes a photo-sensitive material such as polybenzoxazole (PBO), polyimide (PI), benzocyclobutene (BCB), a combination thereof or the like. In some embodiments, each of the redistribution layers 106, 110 and 114 includes copper, nickel, titanium, a combination thereof or the like, and is formed by an electroplating process. The number of the polymer layers or the redistribution layers is not limited by the disclosure.

Continue referring to FIG. 1B, a plurality of connection pads 118a, a plurality of under bump metallization (UBM) pads 118b and a plurality of dummy patterns DP are formed over the redistribution layer structure 117. The connection pads 118a and the UBM pads 118b are electrically connected to the redistribution layer structure 117. In some embodiments, the UBM pads 118b surround the connection pads 118a, and the dimension of the UBM pads 118b is greater than (e.g., at least 3 times) the dimension of the connection pads 118a. In some embodiments, the center of the connection pads 118a is off-centered from the center of the UBM pads 118b. Specifically, as shown in FIG. 1B, the distance D1 between the adjacent connection pad 118a and UBM pad 118b at one side (e.g., left side) of the carrier C is greater than (e.g., at least 2 times) the distance D2 between the adjacent connection pad 118a and UBM pad 118b at the opposite side (e.g., right side) of the carrier C. In some embodiments, the distance from an outermost connection pad 118a to an innermost UBM pad 118b is "D1", the distance from an outermost dummy pattern DP to the same innermost UBM pad 118b is "d", and the ratio of "d" to "D1" ranges from about 0.1 to 0.9, from about 0.2 to 0.8, or from about 0.5 to 0.7. For example, the ratio of "d" to "D1" can be, for example but is not limited to, about 0.1, 0.15, 0.2, 0.25, 0.3, 0.35, 0.4, 0.45, 0.5, 0.55, 0.6, 0.65, 0.7, 0.75, 0.8, 0.85, 0.9, including any range between any two of the preceding values.

The dummy patterns DP are at a floating potential and are electrically insulated from the redistribution layer structure 117. In some embodiments, the dummy patterns DP are between the connection pads 118a and the UBM pads 118b. Specifically, the dummy patterns DP are disposed at a single side of the connection pads 118a, and are not disposed at the opposite side of the connection pads 118a, as shown in FIG. 1B. The dummy patterns DP are configured to prevent an underfill material from bleeding to undesired bumps or creeping onto the chip backside during the subsequent underfill dispensing step, which will be described in details below.

In some embodiments, the connection pads 118a, the UBM pads 118b and the dummy patterns DP are made by the same material, provided with substantially equal thickness, and formed simultaneously in the same process step. Specifically, the connection pads 118a, the UBM pads 118b and the dummy patterns DP include copper, nickel, titanium, a combination thereof or the like, and are formed by an electroplating process. In some embodiments, the connection pads 118a, the UBM pads 118b and the dummy patterns DP are defined by the same photolithography reticle or photomask. That is, an additional photolithography reticle for defining the dummy patterns DP is not required. In some embodiments, the connection pads 118a and the dummy patterns DP have a similar shape in a top view, but have different shapes in a cross-sectional view. In alternative embodiments, the connection pads 118a and the dummy patterns DP have a similar shape either in a top view or in a cross-sectional view. In yet alternative embodiments, the connection pads 118a and the dummy patterns DP have different shapes either in a top view or in a cross-sectional view. In some embodiments, the connection pads 118a and the dummy patterns DP have substantially the same dimension or size. In alternative embodiments, the connection pads 118a and the dummy patterns DP have different dimensions or sizes.

Figure 1C:
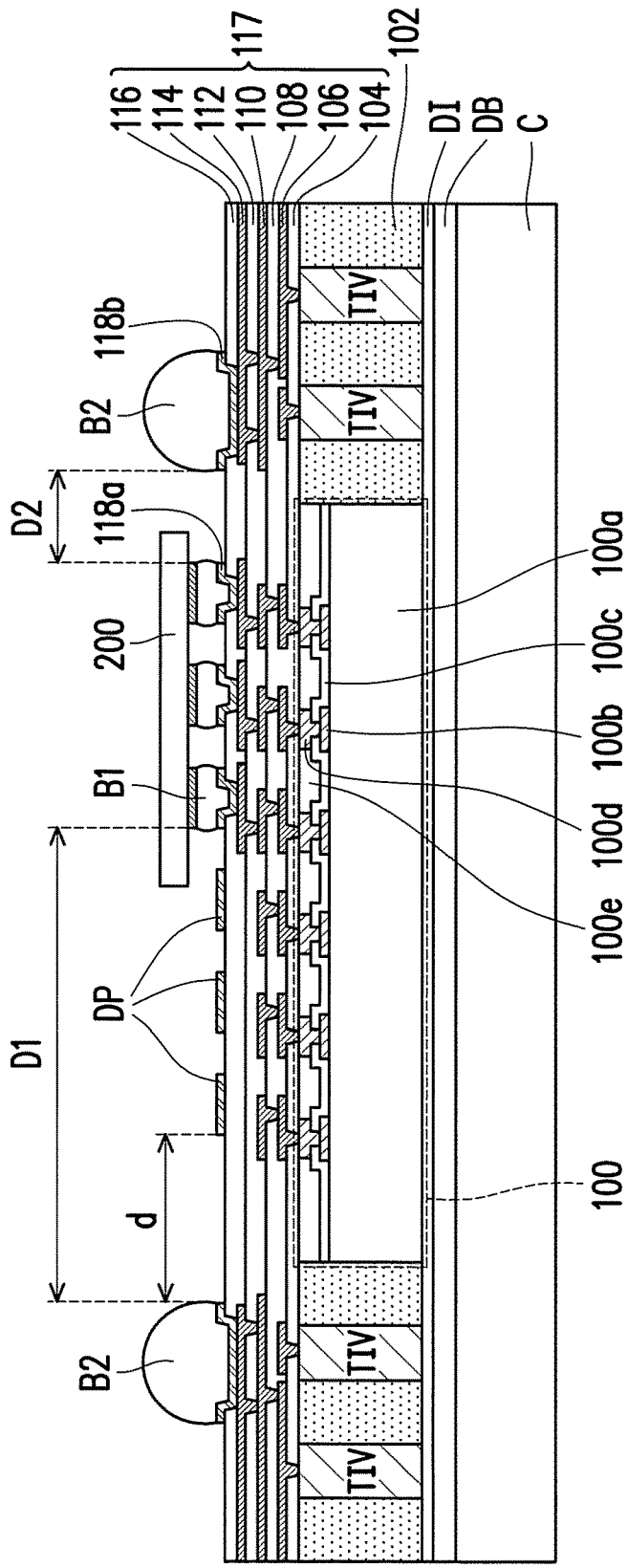

Referring to FIG. 1C, at least one second chip 200 is bonded to the connection pads 118a through a plurality of micro-bumps B1, and a plurality of bumps B2 are placed on and electrically connected to the UBM pads 118b. In some embodiments, the second chip 200 having micro-bumps B1 is bonded to the connection pads 118a with the front side thereof facing the front-side redistribution layer structure 117. In some embodiments, the second chip 200 is an integrated passive device (IPD) including resistors, capacitors, inductors, resonators, filters, and/or the like. In alternative embodiments, the second chip 200 can be an integrated active device (IAD) upon the process requirements. In some embodiments, the dimension of the bumps B2 is greater than (e.g., at least 3 times) the dimension of the micro-bumps B1. Besides, the dimension of the bumps B2 is substantially equal to or slightly greater than the dimension of the underlying UBM pads 118b, and the dimension of the micro-bumps B1 is substantially equal to or slightly greater than the dimension of the underlying connection pads 118a.

In some embodiments, the micro-bumps B1 and bumps B2 may be solder bumps, and/or may include metal pillars (e.g., copper pillars), solder caps formed on metal pillars, and/or the like. When solder is used, the solder may include either eutectic solder or non-eutectic solder. The solder may include lead or be lead-free, and may include Sn—Ag, Sn—Cu, Sn—Ag—Cu, or the like. The micro-bumps B1 and bumps B2 may be formed respectively by a suitable process such as evaporation, electroplating, ball drop, or screen printing.

In some embodiments, at least one of the dummy patterns DP is overlapped with the second chip 200 from a top view. Specifically, portions of the dummy patterns DP are disposed under the edge portion of the second chip 200, as shown in FIG. 1C and FIGS. 2-8. In alternative embodiments, the dummy patterns DP are not overlapped with the second chip 200. In yet alternative embodiments, the edge of at least one of the dummy patterns that is closely adjacent to the connection pads 118a is substantially aligned with the edge of the second chip 200. In some embodiments, the dummy patterns are disposed at one side (e.g., single side) of the second chip. However, the disclosure is not limited thereto. In alternative embodiments, the dummy patterns are disposed at other sides of the second chip upon the process requirements.

Figure 1D:
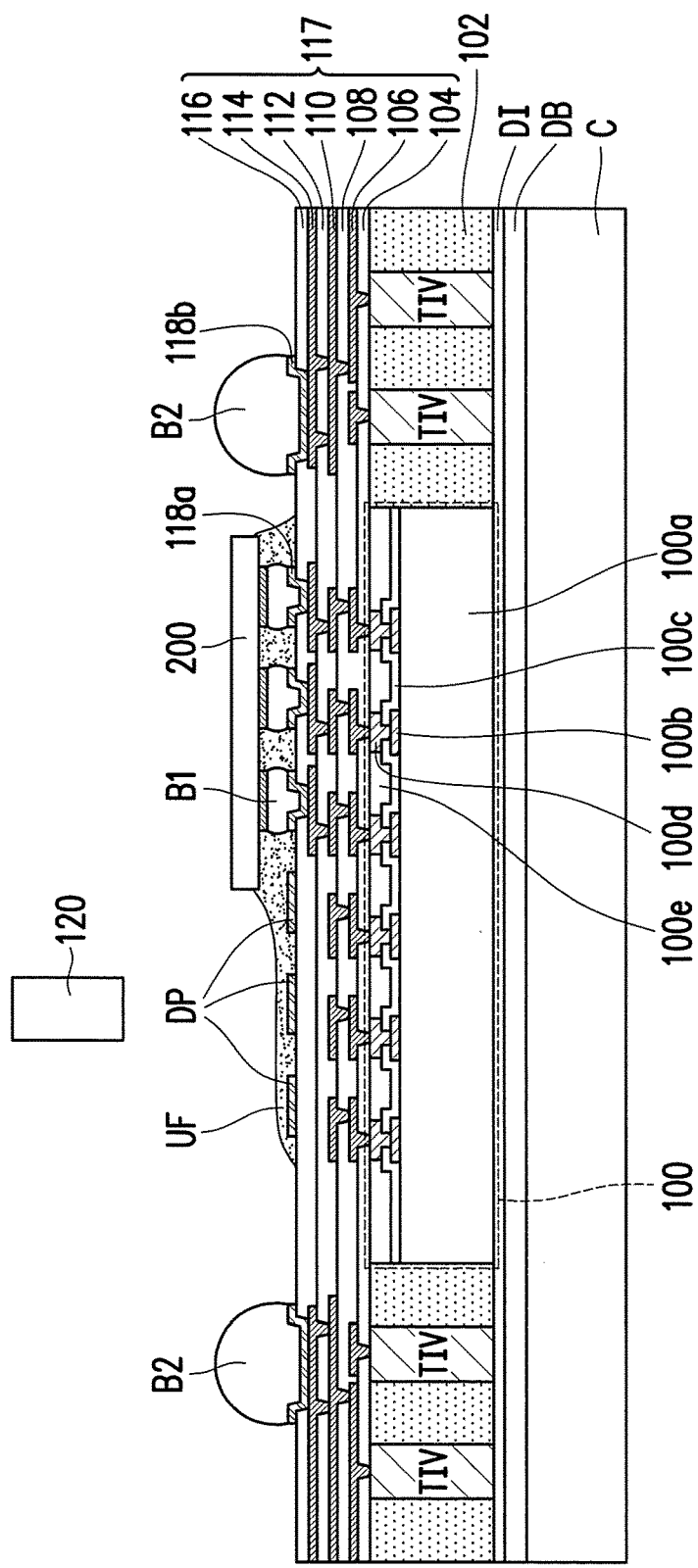

Referring to FIG. 1D, an underfill material is dispensed from a dispenser 120 onto the carrier C at one side of the second chip 200. In some embodiments, the dispenser 120 is located over and corresponds to the dummy patterns DP. The underfill material is then drawn by capillary action and therefore forms an underfill layer UF covering the dummy patterns DP and surrounding the micro-bumps B1. Specifically, the underfill layer UF may completely cover the tops and sidewalls of the dummy patterns DP, fill the gaps between the dummy patterns DP and fill the space between the second chip 200 and the redistribution layer structure 117. The dummy patterns DP constrain the flow of the underfill material, so that the underfill material does not bleed to the bumps B2, flow along the sidewall or even creep onto the backside of the second chip 200 during the underfill dispensing step. From another point of view, the dummy patterns DP function as "armor blocks" that trap the underfill material therein and therefore prevent the underfill material wave from reaching the adjacent bumps B2. In some embodiments, the dummy patterns DP can be referred to as "underfill dissipating blocks" through the disclosure.

Figure 1E:
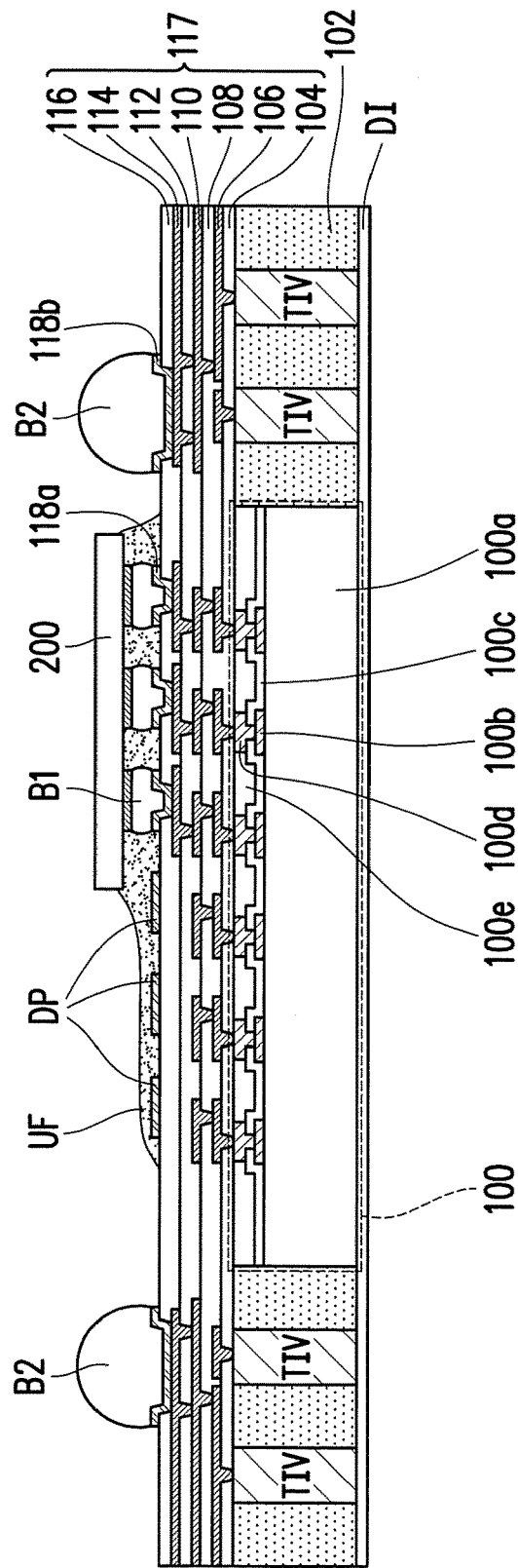

Referring to FIG. 1E, the carrier C is de-bonded from the backside of the structure of FIG. 1D. In some embodiments, the de-bonding layer DB is decomposed under heat of light, and the carrier C is then released from the structure formed thereon.

Figure 1F:
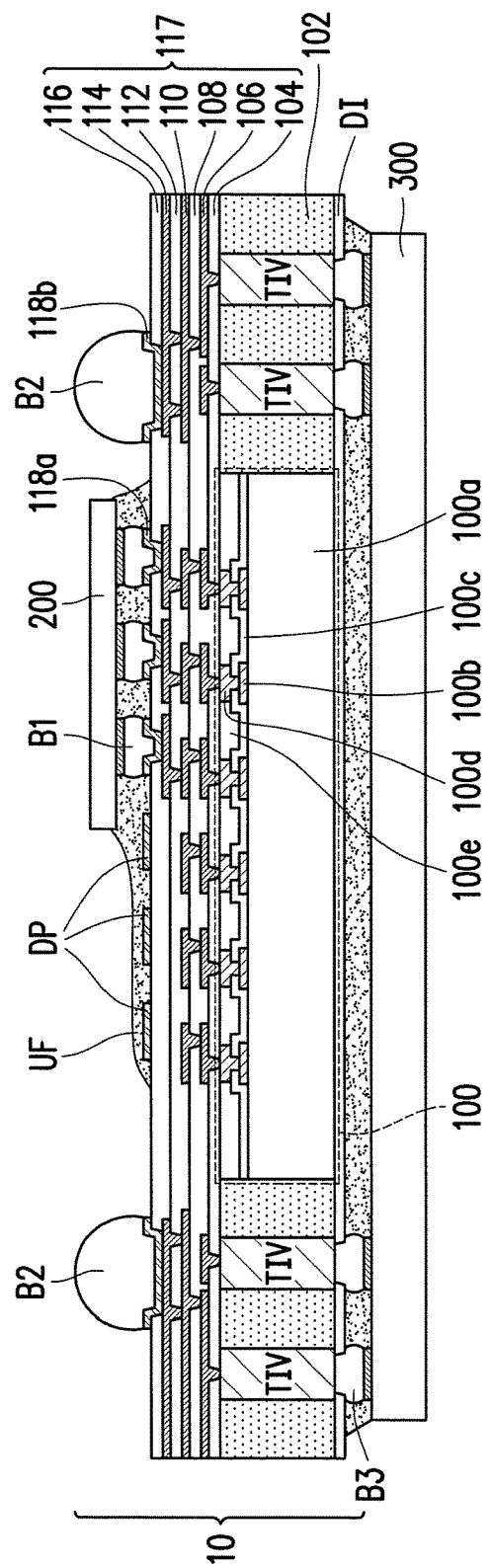

Referring to FIG. 1F, the dielectric layer DI is patterned such that openings are formed to expose the bottom surfaces of the through integrated fan-out vias TIV. In some embodiments, the number of the openings correspond to the number of the through integrated fan-out vias TIV. In some embodiments, the openings of the dielectric layer DI are formed by a laser drilling process or another suitable patterning process. Thereafter, bumps B3 are placed on the exposed surfaces of the through integrated fan-out vias TIV. The bumps B3 may be solder bumps, and/or may include metal pillars (e.g., copper pillars), solder caps formed on metal pillars, and/or the like. The bumps B3 may be formed respectively by a suitable process such as evaporation, electroplating, ball drop, or screen printing. In some embodiments, the dimension of the bumps B3 is between the dimension of the micro-bumps B1 and the dimension of the bumps B2. An integrated fan-out package 10 having dual-side terminals (e.g., bumps B2 and B3) is thus completed.

Afterwards, another package 300 is provided. In some embodiments, the package 300 includes a memory device or another suitable semiconductor device. The package 300 is electrically connected to the integrated fan-out package 10 through the bumps B3 such that a package-on-package (POP) structure is fabricated.

It is noted that the dummy patterns DP of the disclosure play a role of preventing the underfill material from bleeding to undesired bumps B2 or creeping onto the backside of the second chip 200 during the underfill dispensing step. Specifically, the conventional structure without the dummy patterns of the disclosure usually has an underfill bleeding length greater than about 400 µm. However, by disposing the dummy patterns DP of the disclosure, the bleeding length can be significantly reduced to less than about 300 µm. Therefore, the keep out zone (KOZ) from the edge of the second chip 200 to the innermost bumps B2 of the integrated fan-out package 10 can be accordingly reduced.

Figure 4:
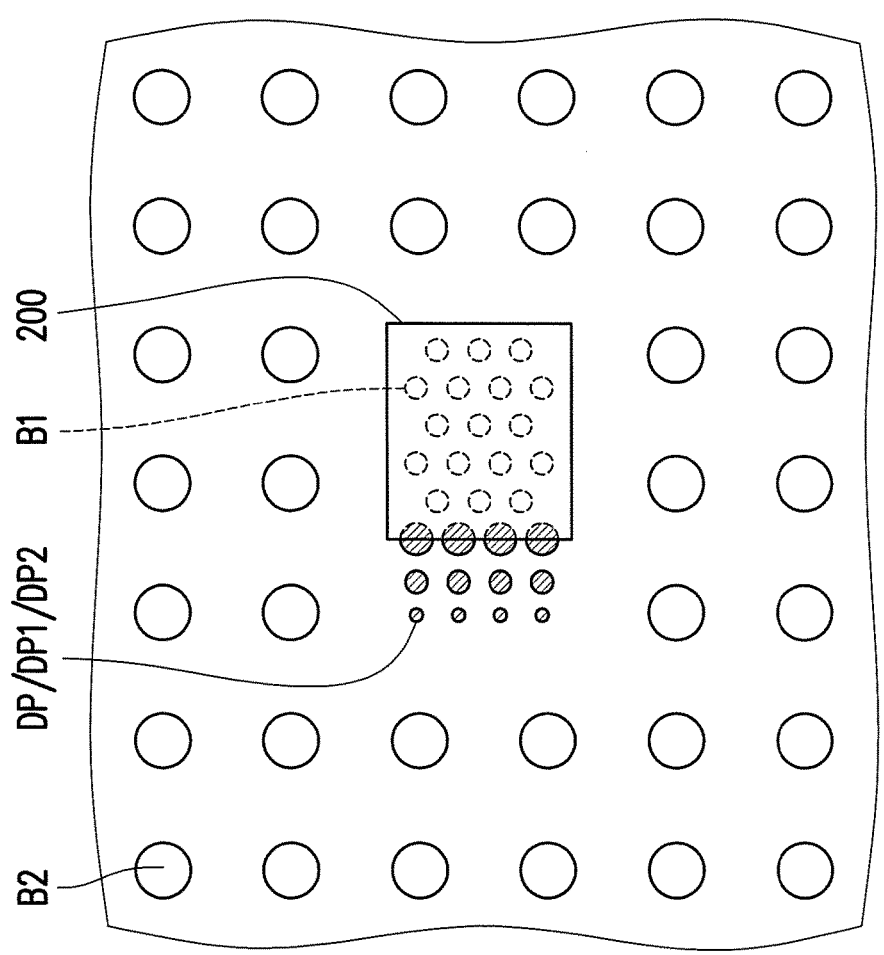
Figure 5:
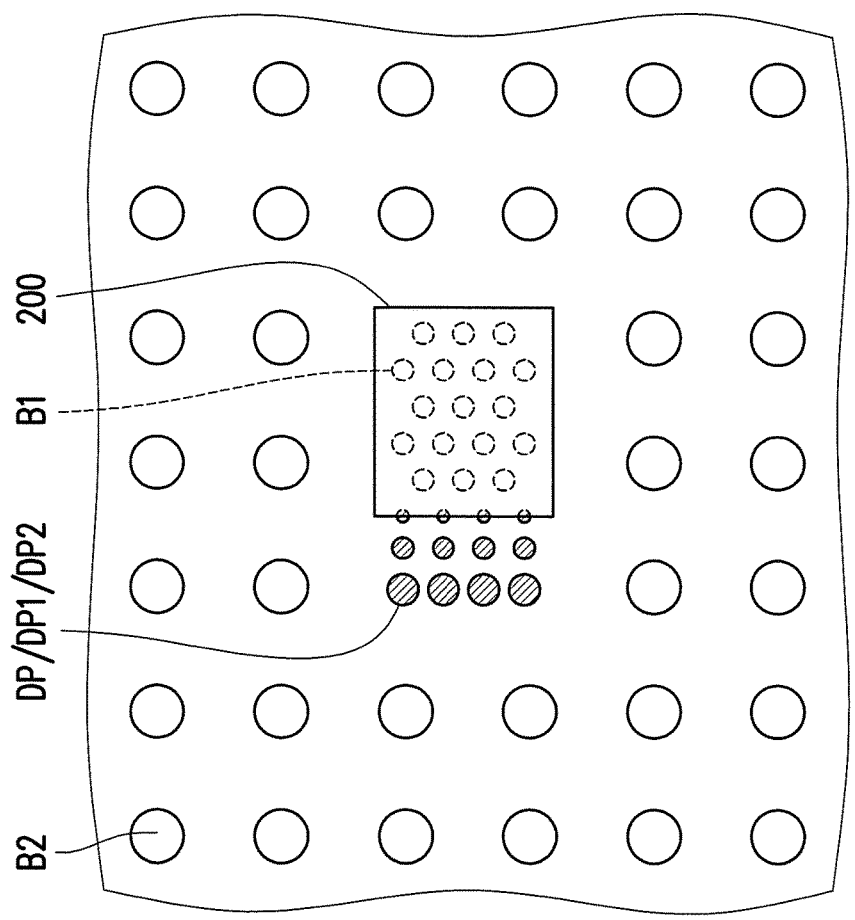
Figure 6:
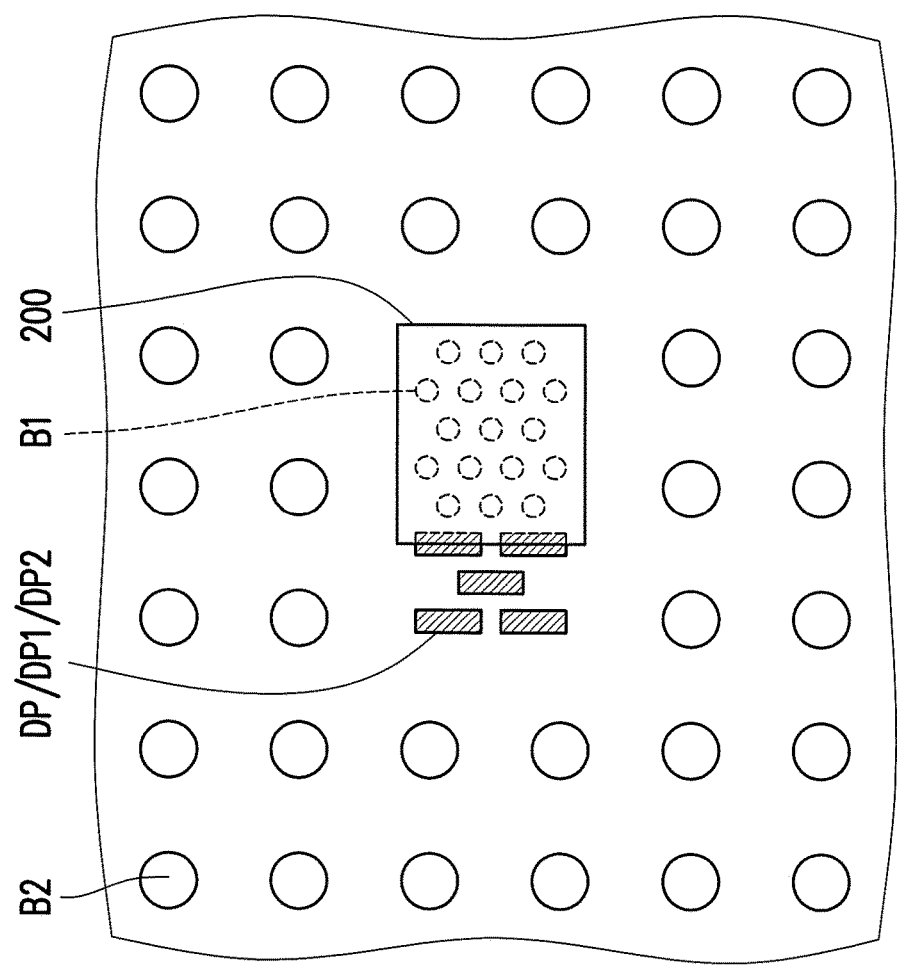
Figure 7:
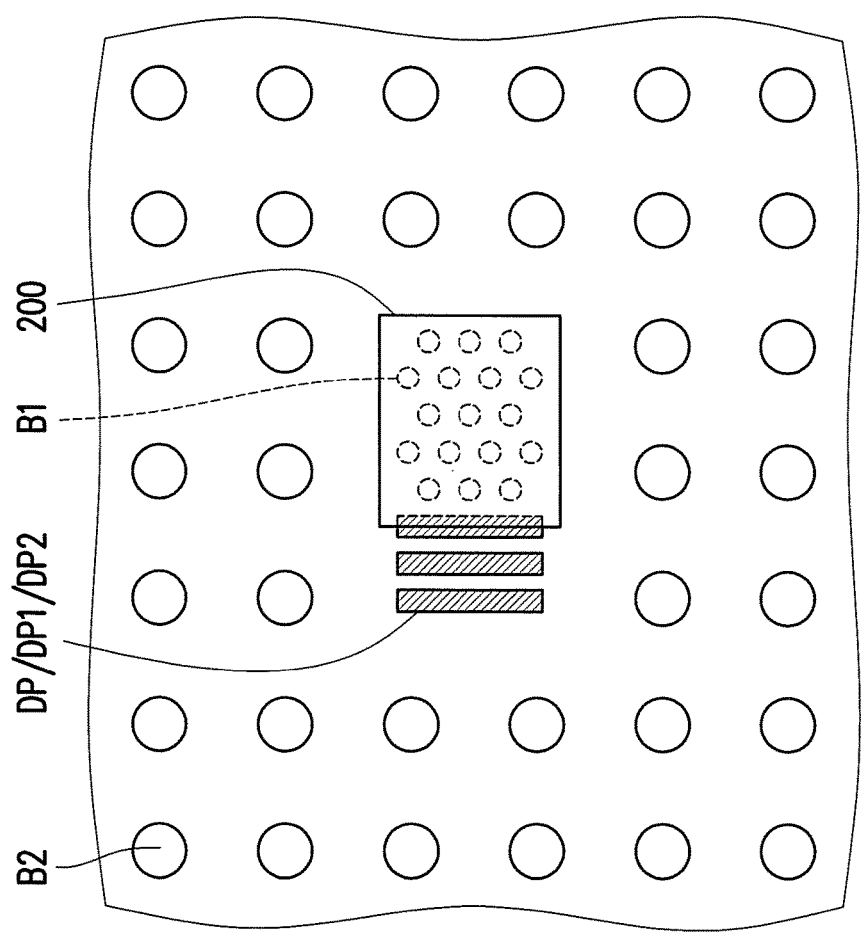
Figure 8:
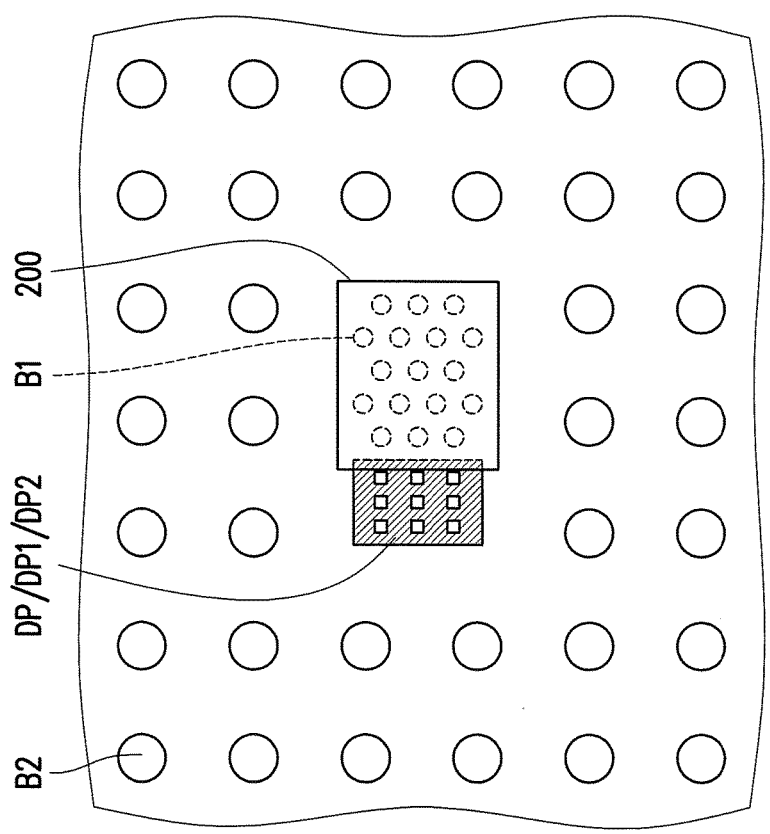

In some embodiments, the dummy patterns DP are in a form of dots, as shown in FIG. 2 to FIG. 5. The dots can be circular, oval, square, rectangular, polygonal or a combination thereof. In alternative embodiments, the dummy patterns DP are in a form of strips or bars, as shown in FIG. 6 to FIG. 7. The strips or bars can be straight, curved, wavy, serpentine or a combination thereof. The strips or bars can be parallel or non-parallel to each other. In yet alternative embodiments, the dummy patterns DP have a mesh structure or are in a form of grids, as shown in FIG. 8. In some embodiments, the dummy patterns DP are separated from each other. In alternative embodiments, at least some of the dummy patterns DP are connected to each other. The shapes and configurations of the dummy patterns are not limited to the disclosure.

Figure 2:
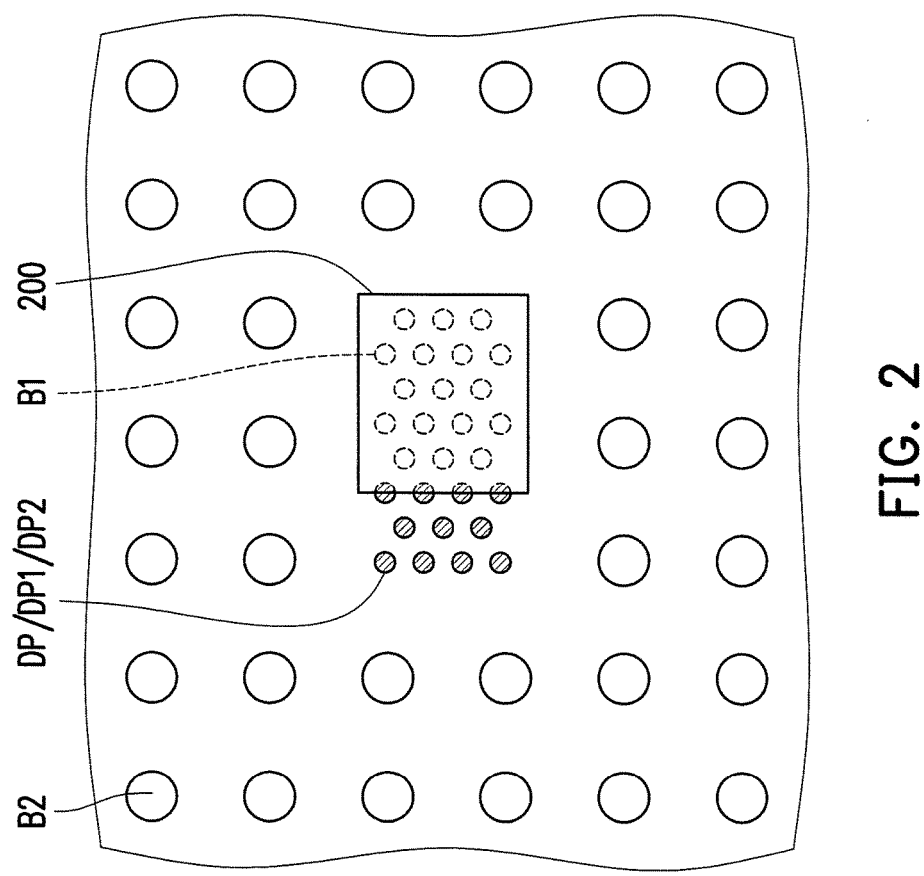
FIG. 2 to FIG. 8 are simplified top views of integrated fan-out packages in accordance with some embodiments.
Figure 3:
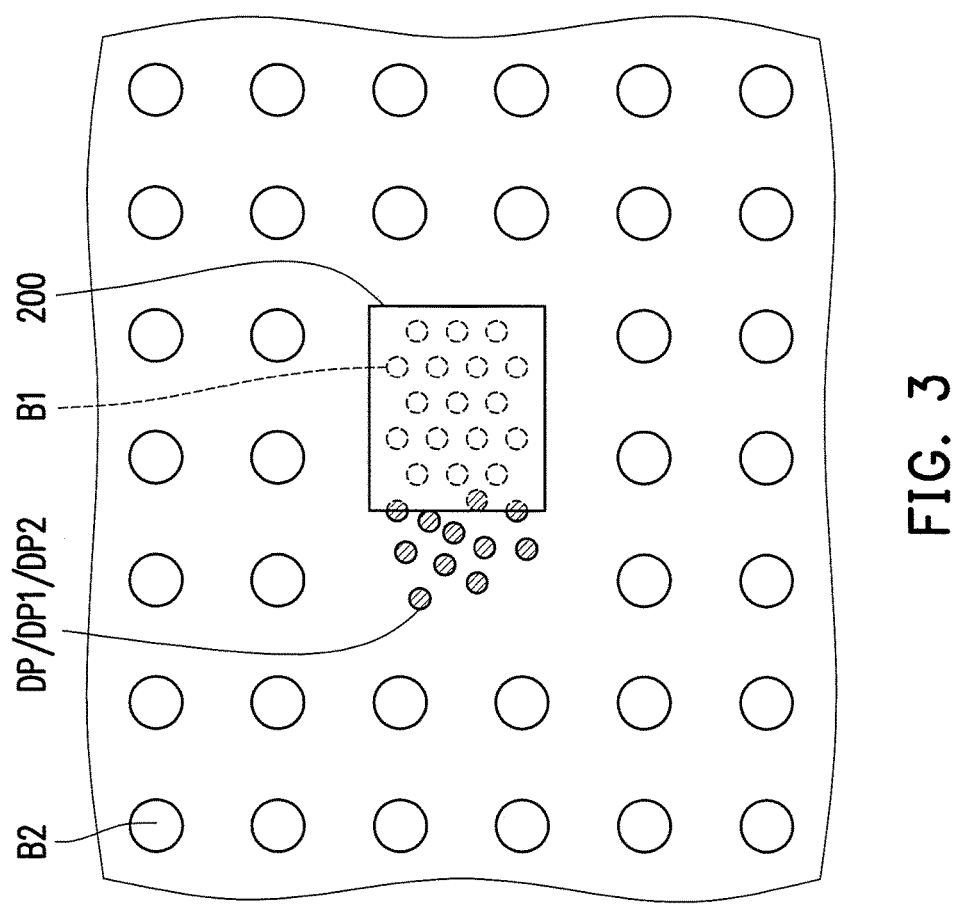

In some embodiments, the dummy patterns DP are arranged regularly or in a regular array, as shown in FIG. 2. For example, the distance between two adjacent dummy patterns is constant, or the pitch of the dummy patterns is constant. In alternative embodiments, the dummy patterns DP are arranged irregularly or randomly, as shown in FIG. 3. For example, the distance between two adjacent dummy patterns is not constant. The numbers of rows and columns and distributions of the dummy patterns are not limited to the disclosure.

In some embodiments, the dummy patterns DP have substantially the same size, as shown in FIG. 2 to FIG. 3. In alternative embodiments, the dummy patterns DP have different sizes, as shown in FIG. 4 to FIG. 5. The sizes of the dummy patterns DP can be gradually reduced away from the edge of the second chip 200, as shown in FIG. 4. The sizes of the dummy patterns DP can be gradually increased away from the edge of the second chip 200, as shown in FIG. 5. In some embodiments, the dimension of one dummy pattern DP is different from the dimension of another dummy pattern DP adjacent to the one dummy pattern DP, and the dimension includes a height, a width, a length or a combination thereof. The sizes and variations of the dummy patterns are not limited by the disclosure.

Dummy patterns are contemplated as falling within the spirit and scope of the present disclosure as long as the dummy patterns prevent an underfill material from bleeding to undesired bumps or creeping onto the undesired surface during the underfill dispensing step and are finally covered by the underfill material.

In some embodiments, in addition to the dummy patterns, the integrated fan-out package can also include a dam structure aside the dummy patterns, so as to further prevent the underfill material from flowing to the adjacent bumps.

Figure 9:
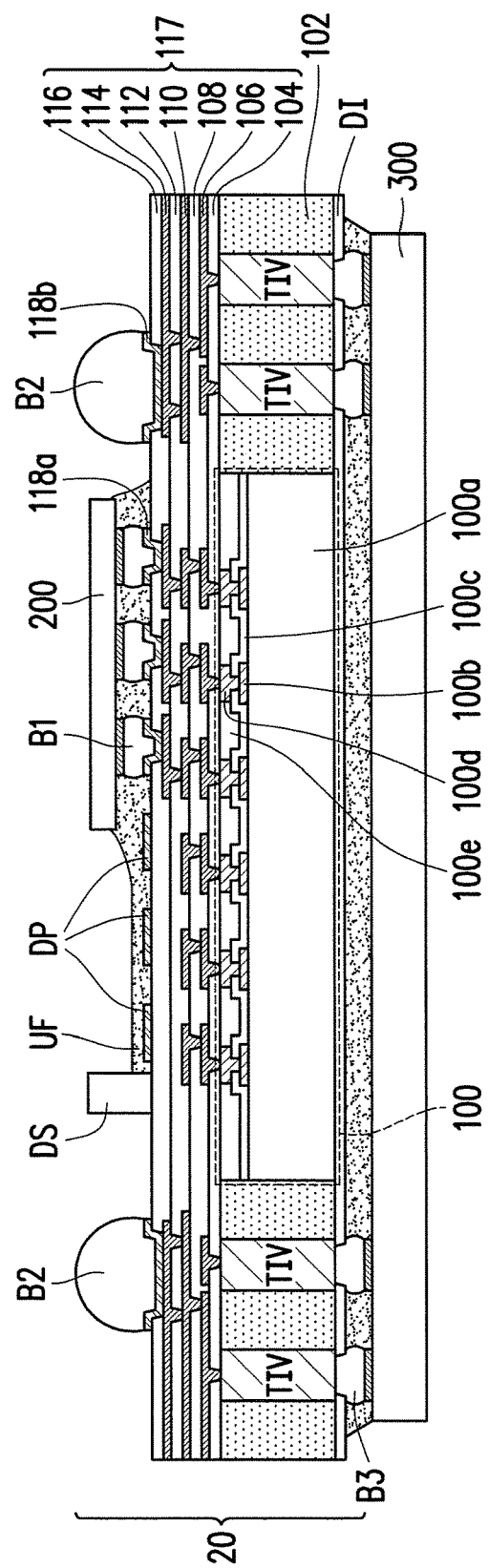
FIG. 9 to FIG. 10 are cross-sectional views of integrated fan-out packages in accordance with alternative embodiments.
Figure 10:
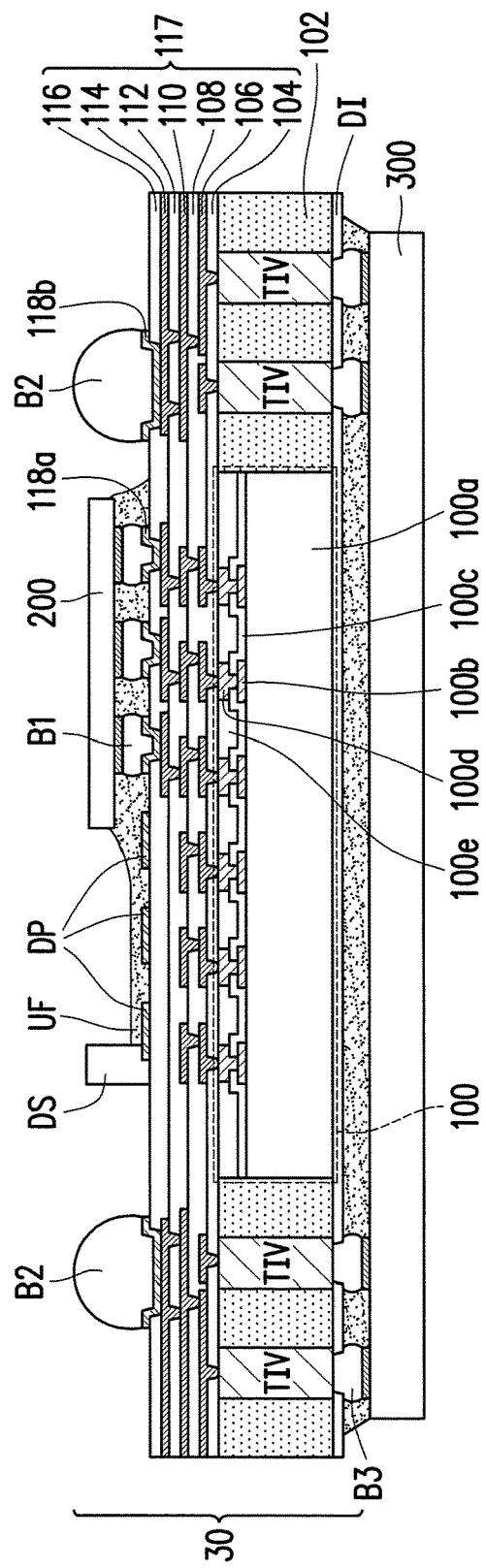
Figure 11:
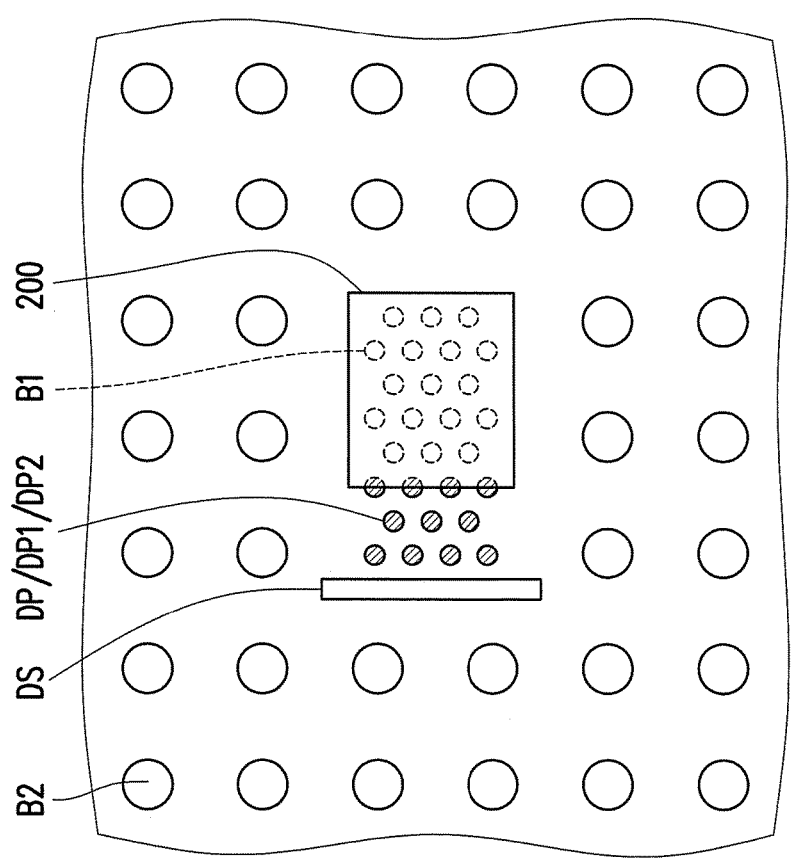
FIG. 11 and FIG. 12 are simplified top views of integrated fan-out packages in accordance with alternative embodiments.
Figure 12:
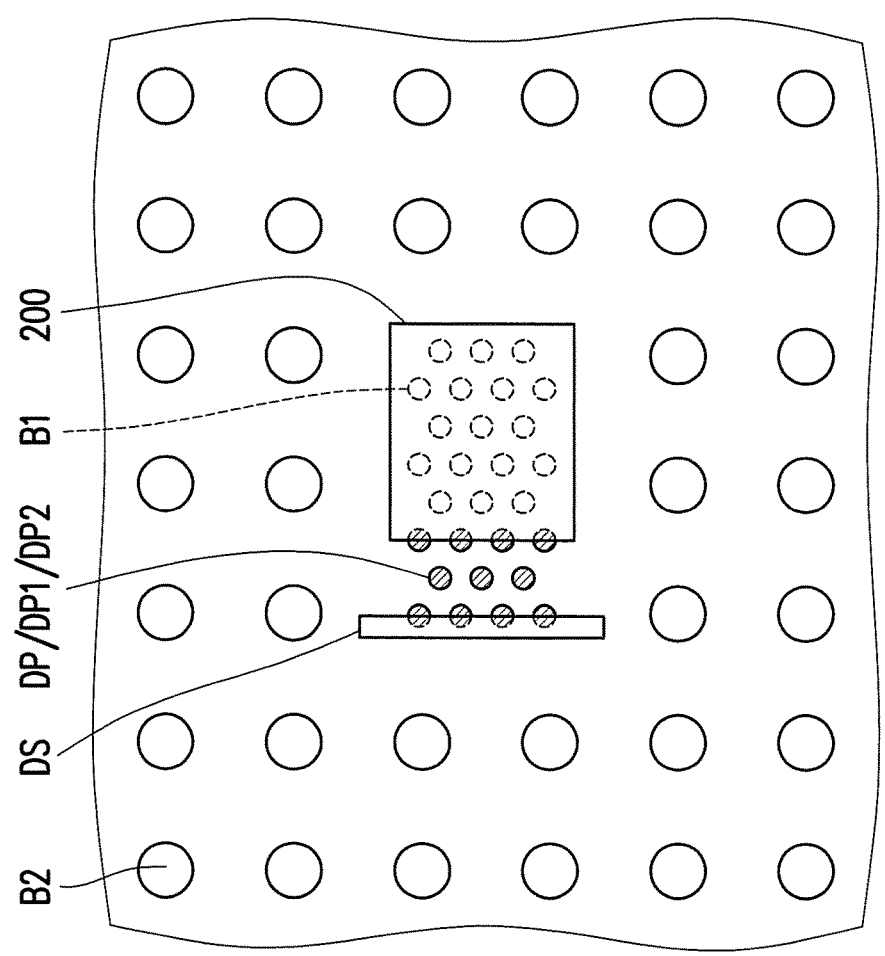

FIG. 9 to FIG. 10 are cross-sectional views of integrated fan-out packages in accordance with alternative embodiments. FIG. 11 and FIG. 12 are simplified top views of integrated fan-out packages in accordance with alternative embodiments.

Referring to FIG. 9 to FIG. 12, the integrated fan-out package 20/30 further includes a dam structure DS formed at the outer side of the dummy patterns DP before forming the underfill layer UF. In some embodiments, the dam structure DS is formed after forming the dummy patterns DP, and the dam structure DS includes a material different from that of the dummy patterns DP. In some embodiments, the dam structure DS is a polymer dam structure including a molding compound such as epoxy, a photo-sensitive material such as polybenzoxazole (PBO), polyimide (PI) or benzocyclobutene (BCB), a combination thereof or the like.

The dam structure DS is formed using dispensing, injecting, and/or spraying techniques. In some embodiments, the dam structure DS can include a metal, but such metal dam structure is at a floating potential and is electrically insulated from the redistribution layer structure 117. In some embodiments, the height of the dam structure DS is greater than (e.g., at least three times) the height of the dummy patterns DP.

In some embodiments, the dam structure DS is between the dummy patterns DP and the bumps B2, and is physically separated from the dummy patterns DP, as shown in FIG. 9 and FIG. 11. In alternative embodiments, the dam structure DS is physically connected to and partially overlapped with the outermost dummy patterns DP, as shown in FIG. 10 and FIG. 12.

In the cases that both the dam structure DS and the dummy patterns DP are provided, the underfill layer UF is formed to cover the dummy patterns DP and physically contact the lower sidewall of the dam structure DS, without flowing over the top of the dam structure DS. In some embodiments, the length of the dam structure DS is greater than the length of the second chip 200, as shown in FIG. 11 to FIG. 12.

The above embodiments in which the dummy patterns and the connection pads are formed simultaneously in the same process step are provided for illustration purposes, and are not construed as limiting the present disclosure. In alternative embodiments, the dummy patterns and the connection pads can be formed separately in different process steps. For example, the dummy patterns can be formed before or after the step of forming the connection pads.

Figure 13:
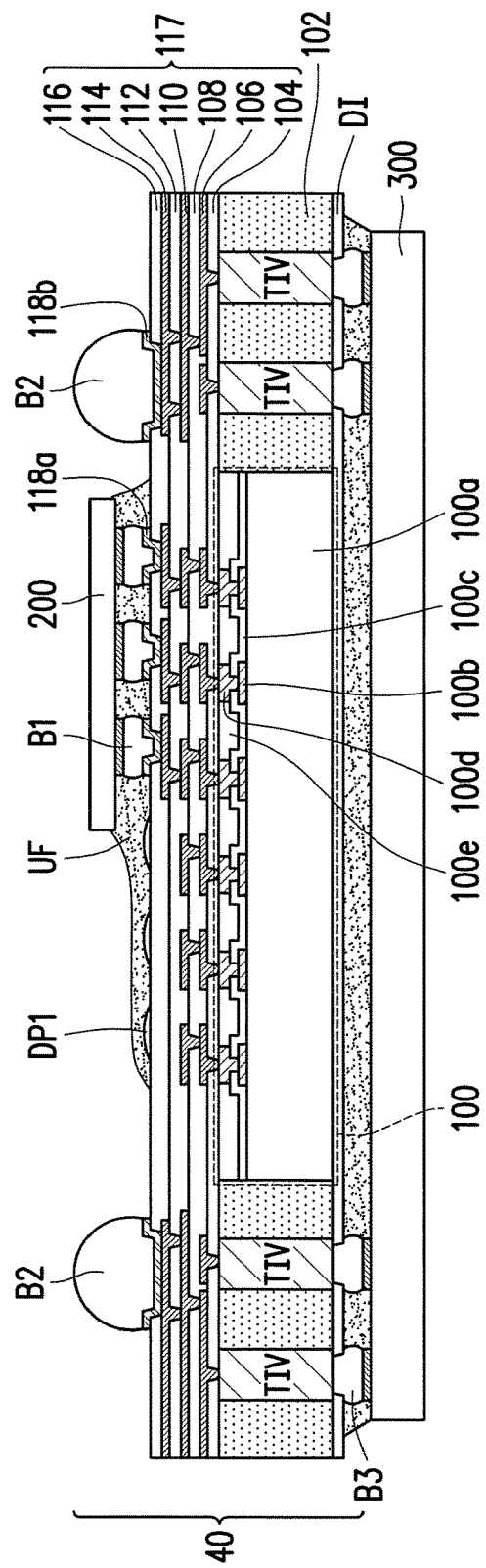
FIG. 13 is a cross-sectional view of an integrated fan-out package in accordance with yet alternative embodiments.

FIG. 13 is a cross-sectional view of an integrated fan-out package in accordance with yet alternative embodiments. As shown in FIG. 13, dummy patterns DP1 are polymer domes including a molding compound such as epoxy, a photosensitive material such as polybenzoxazole (PBO), polyimide (PI) or benzocyclobutene (BCB), a combination thereof or the like. The dummy patterns DP1 are formed using dispensing, injecting, and/or spraying techniques. The shapes, sizes, variations, configurations and distributions of the dummy patterns DP1 are similar to those described for dummy patterns DP, and the details are not iterated herein. Besides, the dam structure DS described above can be optionally formed in the integrated fan-out package 40 of FIG. 13.

The above embodiments in which each dummy pattern is a single-material dummy pattern (e.g., metal dummy pattern or polymer dummy pattern) is provided for illustrations purposes, and are not construed as limiting the present disclosure. In some embodiments, at least one of the dummy patterns can be a composite dummy pattern including a metal and a polymer.

Figure 14:
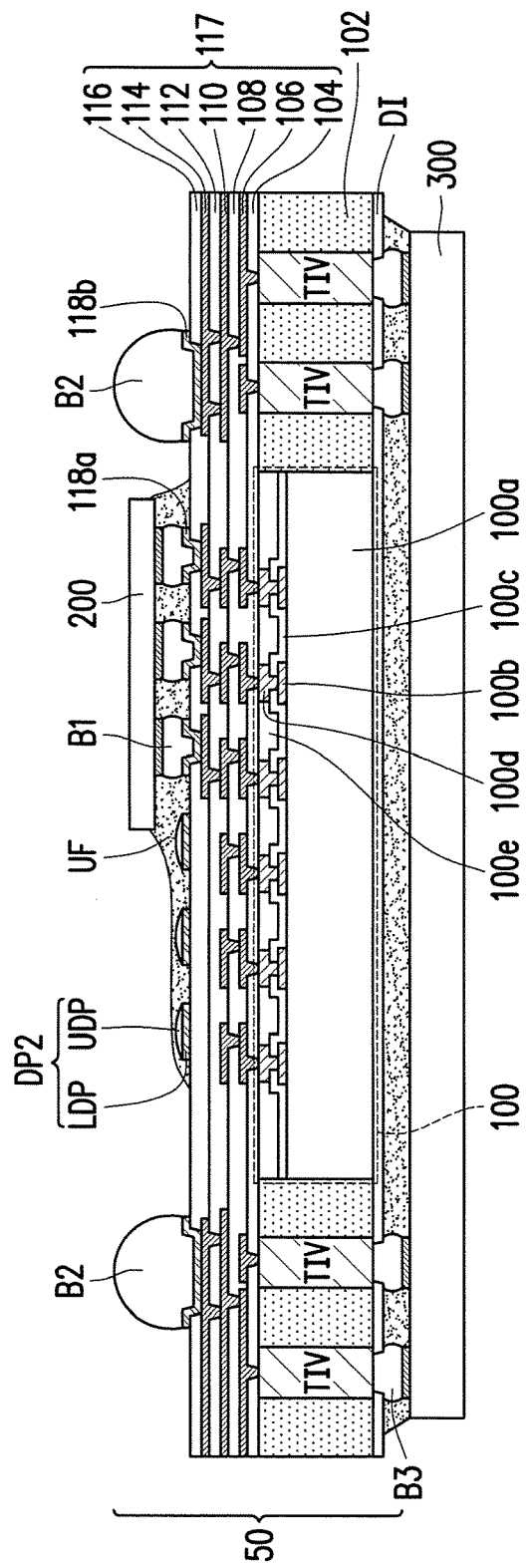
FIG. 14 is a cross-sectional view of an integrated fan-out package in accordance with still alternative embodiments.

FIG. 14 is a cross-sectional view of an integrated fan-out package in accordance with still alternative embodiments. As shown in FIG. 14, each dummy pattern DP2 includes a lower dummy pattern LDP and an upper dummy pattern UDP over the lower dummy pattern LDP. In some embodiments, the lower dummy patterns LDP include a metal and are formed simultaneously during the formation of the connection pads 118a, and the upper dummy patterns UDP include a polymer and are formed after forming the connection pads 118a. The shapes, sizes, variations, configurations and distributions of the dummy patterns DP2 are similar to those described for dummy patterns DP, and the details are not iterated herein. Besides, the dam structure DS described above can be optionally formed in the integrated fan-out package 50 of FIG. 14.

The structures of integrated fan-out packages of the disclosure are illustrated below with reference to FIG. 1F to FIG. 14. The integrated fan-out package 10/20/30/40/50 includes a first chip 100, a redistribution layer structure 117, a plurality of connection pads 118a, a plurality of dummy patterns DP/DP1/DP2, a plurality of micro-bumps B1, a second chip 200 and an underfill layer UF.

The redistribution layer structure 117 is electrically connected to the first chip 100. The connection pads 118a are electrically connected to the redistribution layer structure 117. The dummy patterns DP/DP1/DP2 are at one side (e.g., single side) of the connection pads 118a. In some embodiments, at least one or portions of the dummy patterns DP/DP1/DP2 are overlapped with the second chip 200. In some embodiments, the dummy patterns DP/DP1/DP2 are arranged regularly or irregularly in a form of dots, strips, grids or combinations thereof, and are configured to have substantially the same size or different sizes. The micro-bumps B1 are electrically connected to the connection pads 118a. The second chip 200 such as an integrated passive device is electrically connected to the micro-bumps B1. The underfill layer UF covers the dummy patterns DP/DP1/DP2 and surrounds the micro-bumps B1.

In some embodiments, the dummy patterns DP/DP2 include a metal. In alternative embodiments, the dummy patterns DP1/DP2 include a polymer. In yet alternative embodiments, the dummy patterns DP2 include a combination of a metal and a polymer. In some embodiments, the connection pads 118a and the dummy patterns DP are made by the same material. For example, the connection pads 118a and the dummy patterns DP are defined by the same photolithography reticle in the same UBM in-line process. The connection pads 118a and the dummy patterns DP can be defined to have the same pitch or different pitches. In alternative embodiments, the connection pads 118a and the dummy patterns DP are made by different materials. For example, the dummy patterns DP can be formed by an off-line process.

In some embodiments, the integrated fan-out package 20/30 further includes a dam structure DS aside the dummy patterns DP. In some embodiments, the dam structure DS includes a metal, a polymer or a combination thereof. In some embodiments, the dam structure DS is physically separated from the outermost dummy patterns DP. In alternative embodiments, the dam structure DS is physically connected to and partially overlapped with the outermost dummy patterns DP. In some embodiments, the material of dam structure DS is different from that of the dummy patterns DP. In alternative embodiments, the material of dam structure is the same as that of the dummy patterns.

The integrated fan-out package 10/20/30/40/50 further includes a plurality of UBM pads 118b and a plurality of bumps B2. The UBM pads 118b are electrically connected to the redistribution layer structure 117 and aside (or completely surrounding) the connection pads 118a. In some embodiments, the dimension of the bumps B2 is greater than that of the micro-bumps B1.

The above embodiments in which at least one of the dummy patterns is overlapped with the second chip are provided for illustration purposes, and are not construed as limiting the present disclosure. In some embodiments, upon the process requirements, the dummy patterns DP/DP1/DP2 can be designed to not overlap with the second chip 200, as shown in the integrated fan-out packages 11, 21, 31, 41 and 51 of FIG. 15 to FIG. 19.

Figure 15:
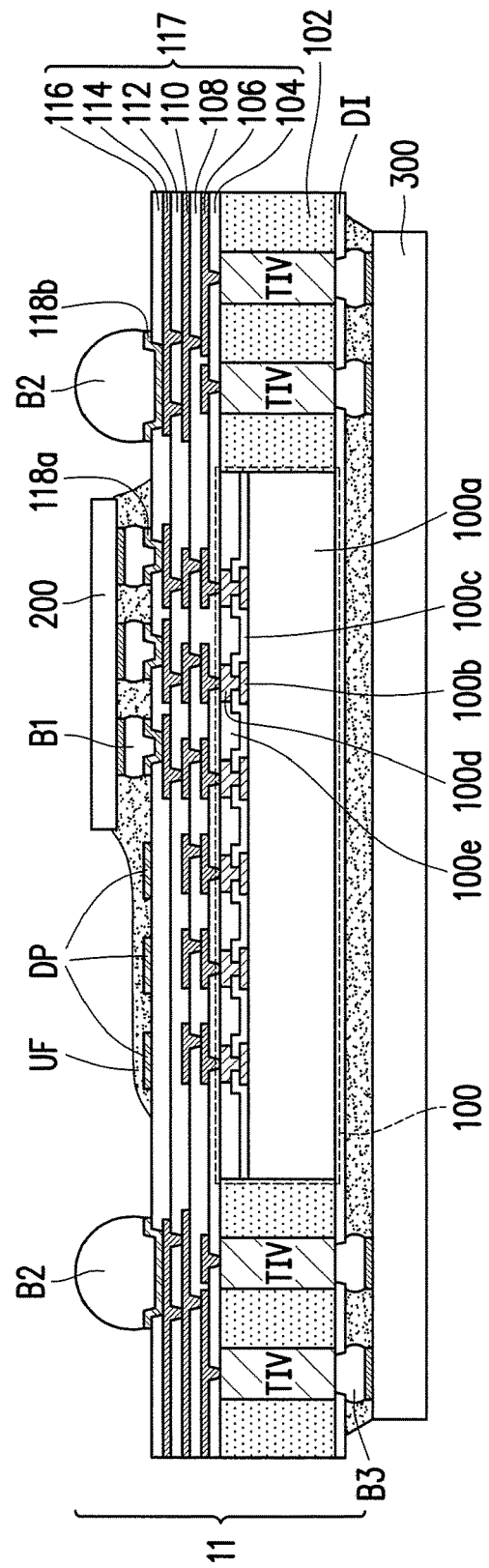
FIGS. 15-19 are cross-sectional views of integrated fan-out packages in accordance with some embodiments.
Figure 16:
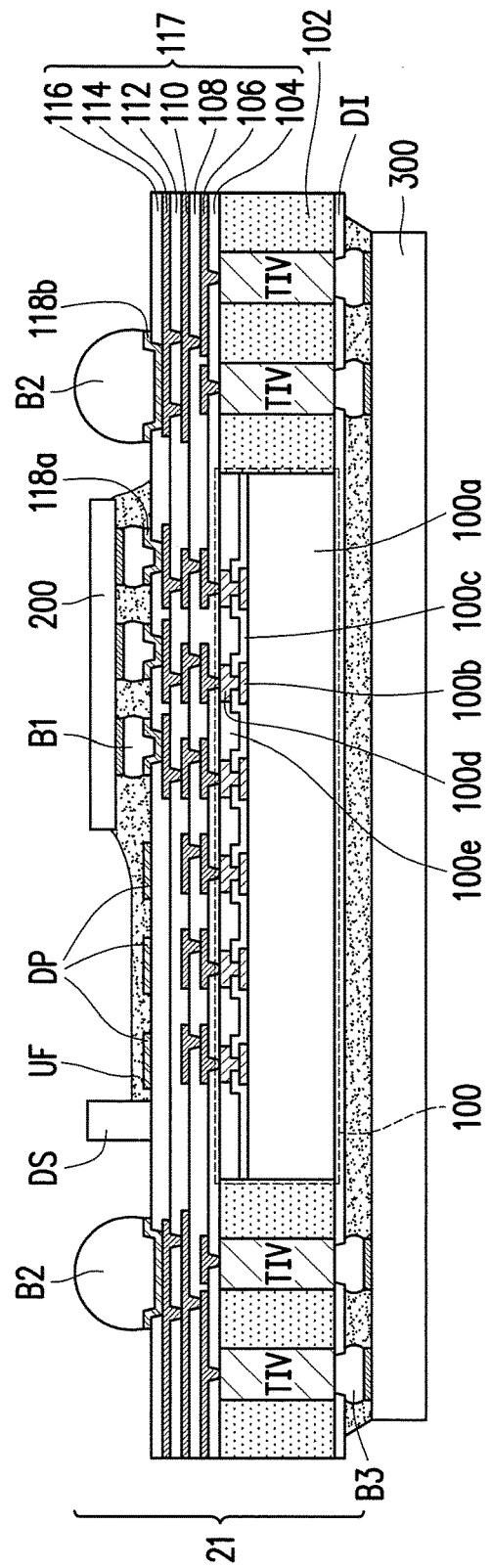
Figure 17:
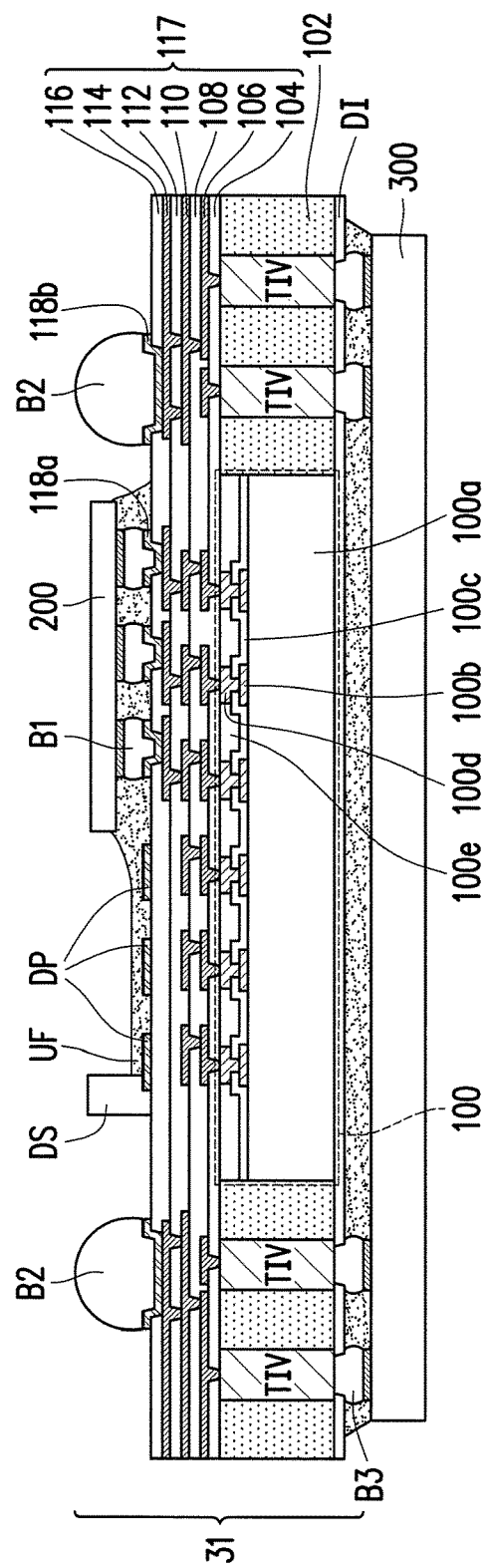
Figure 18:
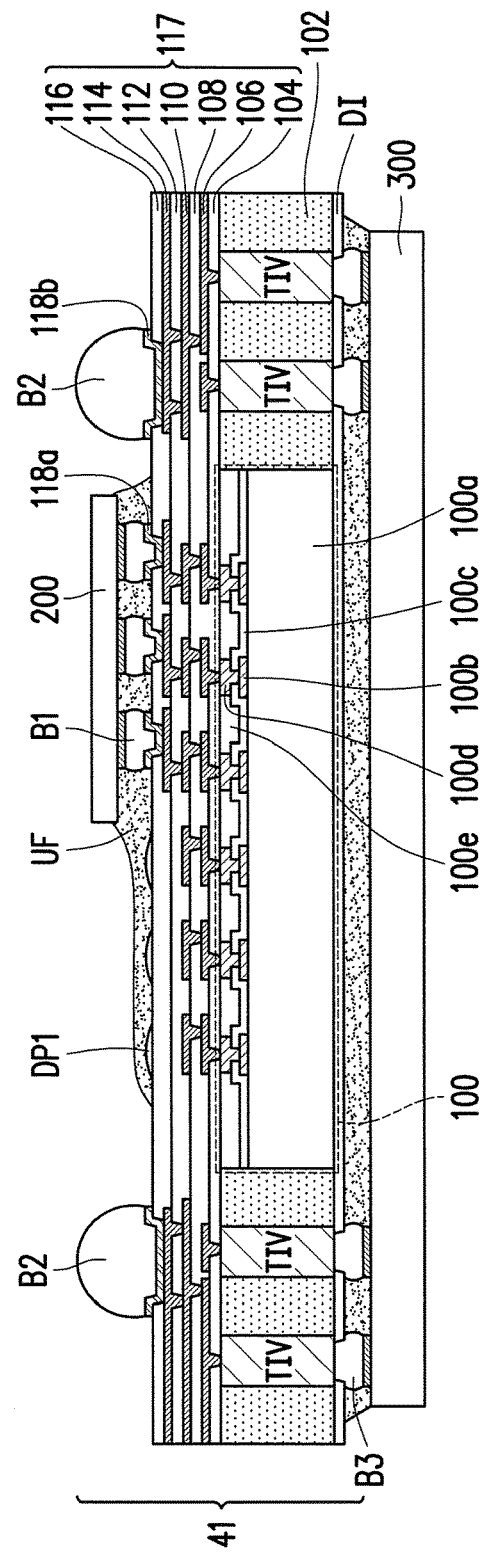
Figure 19:
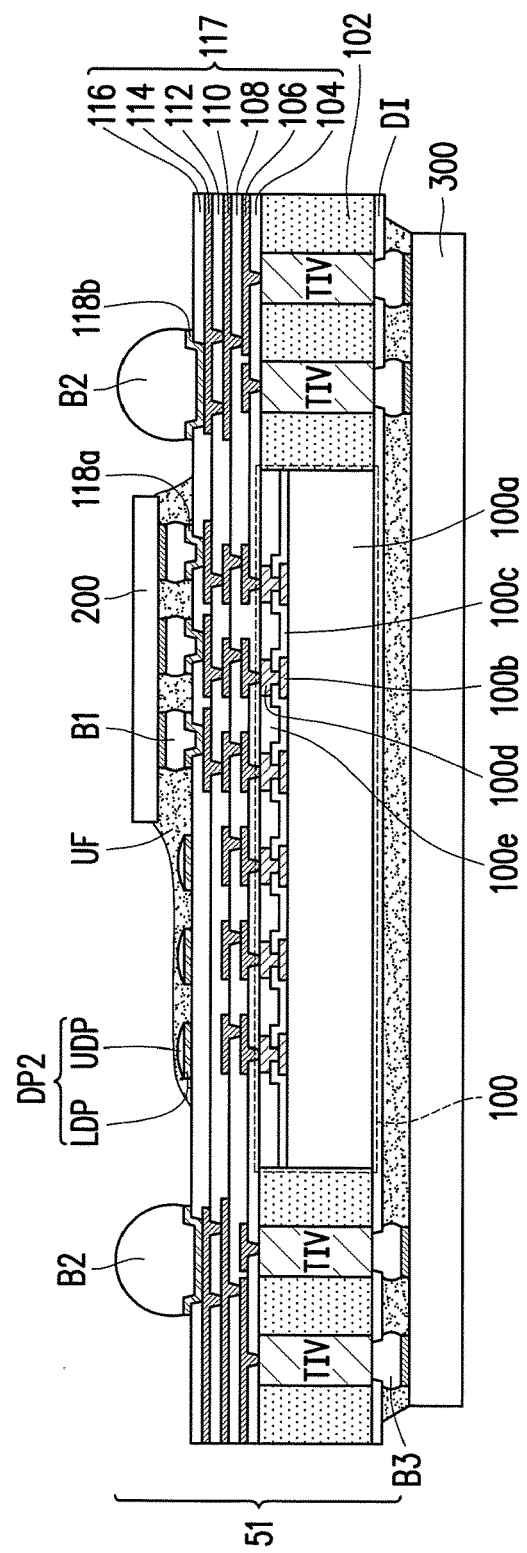

Specifically, the integrated fan-out package 11 of FIG. 15 is similar to the integrated fan-out package 10 of FIG. 1F, except that the dummy patterns DP of FIG. 15 are not overlapped with the second chip 200. The integrated fan-out package 21 of FIG. 16 is similar to the integrated fan-out package 20 of FIG. 9, except that the dummy patterns DP of FIG. 16 are not overlapped with the second chip 200. The integrated fan-out package 31 of FIG. 17 is similar to the integrated fan-out package 30 of FIG. 10, except that the dummy patterns DP of FIG. 17 are not overlapped with the second chip 200. The integrated fan-out package 41 of FIG. 18 is similar to the integrated fan-out package 40 of FIG. 13, except that the dummy patterns DP1 of FIG. 18 are not overlapped with the second chip 200. The integrated fan-out package 51 of FIG. 19 is similar to the integrated fan-out package 50 of FIG. 14, except that the dummy patterns DP2 of FIG. 19 are not overlapped with the second chip 200.

In view of the above, in the integrated fan-out package of the present disclosure, multiple dummy patterns and an optional dam structure are provided over a redistribution layer structure and at one side of the micro-bumps. The dummy patterns are configured to prevent an underfill material from bleeding to undesired bumps or creeping onto the chip backside during the underfill dispensing step. Besides, the dummy patterns of the disclosure are beneficial to reduce the underfill bleeding/creeping length and therefore provide a wider underfill dispensing window for production. Moreover, the dummy patterns of the disclosure enhance capillary attraction during the dispensing step, and therefore shorten the underfill dispensing time and improve the wafer per hour (WPH) in production.

In accordance with some embodiments of the present disclosure, an integrated fan-out package includes a first chip, a redistribution layer structure, a plurality of connection pads, a plurality of micro-bumps, a second chip and an underfill layer. The redistribution layer structure is electrically connected to the first chip. The connection pads are electrically connected to the redistribution layer structure. The dummy patterns are at one side of the connection pads. The micro-bumps are electrically connected to the connection pads. The second chip is electrically connected to the micro-bumps. The underfill layer covers the dummy patterns and surrounds the micro-bumps.

In accordance with alternative embodiments of the present disclosure, an integrated fan-out package includes a first chip, a redistribution layer structure, a plurality of micro-bumps, a plurality of bumps, a second chip, a plurality of dummy patterns and an underfill layer. The redistribution layer structure is electrically connected to the first chip. The micro-bumps are electrically connected to the redistribution layer. The bumps are electrically connected to the redistribution layer and aside the micro-bumps. The second chip is electrically connected to the micro-bumps. The dummy patterns are between the micro-bumps and the bumps. The underfill layer covers the dummy patterns, surrounds the micro-bumps and is physically separated from the bumps. Besides, portions of the dummy patterns are overlapped with the second chip.

In accordance with yet alternative embodiments of the present disclosure, a method of forming an integrated fan-out package includes at least the following steps. A redistribution layer structure is formed over a first chip. A plurality of connection pads and a plurality of dummy patterns are formed over the redistribution layer structure, wherein the dummy patterns are at one side of the connection pads. A second chip is bonded to the connection pads through a plurality of micro-bumps. An underfill layer is formed to cover the dummy patterns and surround the micro-bumps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
   a first chip;
   a redistribution layer structure electrically connected to the first chip;
   a plurality of connection pads electrically connected to the redistribution layer structure;
   a plurality of dummy patterns at one side of the plurality of connection pads;
   a plurality of micro-bumps electrically connected to the plurality of connection pads;
   a second chip electrically connected to the micro-bumps; and
   an underfill layer covering the plurality of dummy patterns and surrounding the micro-bumps,
   wherein the redistribution layer structure and the second chip are at the same side of the first chip.

2. The integrated fan-out package of claim 1, wherein at least one of the plurality of dummy patterns is overlapped with the second chip.

3. The integrated fan-out package of claim 1, wherein the plurality of dummy patterns are not overlapped with the second chip.

4. The integrated fan-out package of claim 1, wherein the dummy patterns comprise a metal, a polymer or a combination thereof.

5. The integrated fan-out package of claim 1, further comprising a dam structure aside the plurality of dummy patterns, wherein the dam structure is physically connected to and partially overlapped with the outermost dummy patterns.

6. The integrated fan-out package of claim 1, further comprising:
   a plurality of under bump metallization (UBM) pads electrically connected to the redistribution layer structure and surrounding the plurality of connection pads; and
   a plurality of bumps electrically connected to the plurality of UBM pads,
   wherein a dimension of the plurality of bumps is greater than a dimension of the plurality of micro-bumps.

7. The integrated fan-out package of claim 1, wherein the plurality of dummy patterns are arranged regularly.

8. The integrated fan-out package of claim 1, wherein the plurality of dummy patterns are arranged irregularly.

9. The integrated fan-out package of claim 1, wherein the plurality of dummy patterns are in a form of dots, strips, grids or combinations thereof.

10. An integrated fan-out package, comprising:
    a first chip;
    a redistribution layer structure electrically connected to the first chip;
    a plurality of micro-bumps electrically connected to the redistribution layer;

a plurality of bumps electrically connected to the redistribution layer and aside the plurality of micro-bumps;

a second chip electrically connected to the micro-bumps;

a plurality of dummy patterns between the micro-bumps and the bumps; and an underfill layer covering the plurality of dummy patterns, surrounding the micro-bumps and physically separated from the bumps, wherein portions of the plurality of dummy patterns are overlapped with each of the first chip and the second chip.

11. The integrated fan-out package of claim 10, wherein the plurality of dummy patterns have substantially the same size.

12. The integrated fan-out package of claim 10, wherein the plurality of dummy patterns have different sizes.

13. The integrated fan-out package of claim 10, wherein the plurality of dummy patterns are in a form of dots, strips, grids or combinations thereof.

14. The integrated fan-out package of claim 10, wherein the plurality of micro-bumps are electrically connected to the redistribution layer through a plurality of connection pads, and the connection pads and the dummy patterns are made by the same material.

15. The integrated fan-out package of claim 10, wherein the dummy patterns comprise a metal, a polymer or a combination thereof.

16. The integrated fan-out package of claim 10, further comprising a dam structure at an outer side of the dummy patterns, wherein a material of dam structure is different from a material of the dummy patterns.

17. A method of forming an integrated fan-out package, comprising:

forming a redistribution layer structure over a first chip;

forming a plurality of connection pads and a plurality of dummy patterns over the redistribution layer structure, wherein the plurality of dummy patterns are at one side of the plurality of connection pads;

bonding a second chip to the plurality of connection pads through a plurality of micro-bumps; and forming an underfill layer, wherein the underfill layer covers the plurality of dummy patterns and surrounds the plurality of micro-bumps.

18. The method of claim 17, wherein the dummy patterns comprise a metal, a polymer or a combination thereof.

19. The method of claim 17, further comprising forming a dam structure at an outer side of the plurality of dummy patterns before forming the underfill layer, wherein the underfill layer physically contacts the dam structure but does not flow over the dam structure.

20. The method of claim 17, wherein the plurality of connection pads and the plurality of dummy patterns are defined by the same photolithography reticle.

* * * * *